United States Patent
Tripurari Jayaraman et al.

(10) Patent No.: US 12,170,536 B2
(45) Date of Patent: Dec. 17, 2024

(54) AMPLIFIER WITH INTEGRATED NOTCH FILTER

(71) Applicant: QUALCOMM Incorporated, San Diego, CA (US)

(72) Inventors: Karthik Tripurari Jayaraman, San Diego, CA (US); Bao Huu Lam, San Diego, CA (US); Xingyi Hua, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 320 days.

(21) Appl. No.: 17/658,379

(22) Filed: Apr. 7, 2022

(65) Prior Publication Data
US 2023/0327693 A1  Oct. 12, 2023

(51) Int. Cl.
| H04B 1/04 | (2006.01) |
| H03F 1/26 | (2006.01) |
| H03H 7/01 | (2006.01) |
| H04B 1/10 | (2006.01) |
| H04K 3/00 | (2006.01) |

(52) U.S. Cl.
CPC ............. *H04B 1/1036* (2013.01); *H03F 1/26* (2013.01); *H03H 7/01* (2013.01); *H04B 1/0458* (2013.01); *H04B 1/0475* (2013.01); *H04K 3/20* (2013.01); *H03H 2007/013* (2013.01)

(58) Field of Classification Search
None
See application file for complete search history.

(56) References Cited

U.S. PATENT DOCUMENTS

| 7,949,322 | B2 * | 5/2011 | Kim ................... H03F 3/45188 |
| | | | 455/248.1 |
| 9,455,757 | B2 | 9/2016 | Tripurari et al. |
| 9,712,195 | B2 * | 7/2017 | Wang .................. H04B 1/1027 |
| 11,159,191 | B1 * | 10/2021 | Mohammadnezhad ..................... |
| | | | H03G 3/3052 |
| 11,245,372 | B2 | 2/2022 | Hua et al. |
| 2010/0026547 | A1 | 2/2010 | Weissman et al. |

(Continued)

FOREIGN PATENT DOCUMENTS

WO  WO-2024054748 A1 *  3/2024  ............. H03F 1/223

OTHER PUBLICATIONS

Partial International Search Report—PCT/US2023/013904—ISA/EPO—Jun. 12, 2023.

(Continued)

*Primary Examiner* — Pablo N Tran
(74) *Attorney, Agent, or Firm* — Haynes and Boone LLP

(57) ABSTRACT

Techniques for providing low-cost and effective jammer rejection for an amplifier is disclosed. The amplifier includes an input node and an output node, a first transistor and a second transistor, a load circuitry, an inductor, and a capacitor. A first terminal of the first transistor is coupled to a ground. A second terminal of the first transistor is coupled to a first terminal of the second transistor. A second terminal of the second transistor is coupled to the output node. The load circuitry is coupled between a power supply and the second terminal of the second transistor. A first terminal of the inductor is coupled to the ground through a first switch. A first terminal of the capacitor is coupled to the first terminal of the second transistor and a second terminal of the capacitor is coupled to a second terminal of the inductor.

20 Claims, 10 Drawing Sheets

(56) References Cited

U.S. PATENT DOCUMENTS

| | | |
|---|---|---|
| 2012/0274403 A1 | 11/2012 | Kim et al. |
| 2015/0235971 A1 | 8/2015 | Smith et al. |
| 2018/0323821 A1 | 11/2018 | Chabert et al. |
| 2022/0085773 A1 | 3/2022 | Seshita et al. |
| 2023/0327693 A1* | 10/2023 | Tripurari Jayaraman .................. H03G 3/3052 455/552.1 |
| 2024/0080062 A1* | 3/2024 | Wang ........................ H04B 1/44 |

OTHER PUBLICATIONS

International Search Report and Written Opinion—PCT/US2023/013904—ISA/EPO—Sep. 28, 2023.
Jeon Y., et al., "A Wideband Digital TV Receiver Front-end with On-chip Notch Filter", 2019 International Conference on Electronics, Information, and Communication (ICEIC), Institute of Electronics and Information Engineers (IEIE), Jan. 22, 2019, 2 Pages, XP033544800, p. 1, Left-hand Column line 18—p. 2, Right-hand Column line 2, figures 1-5.

* cited by examiner

AMPLIFIER WITH INTEGRATED NOTCH FILTER

FIELD OF TECHNOLOGY

The technology discussed below relates generally to wireless communication circuitry, and, in particular, to an amplifier with integrated notch filter for jammer rejection in radio receivers.

BACKGROUND

Modern wireless devices are commonly designed to concurrently support multiple radio communication links. For example, a single smart phone device may be required to simultaneously connect to a wide-area network (WAN), a wireless local-area network (WLAN), and/or other radio-frequency (RF) communication links such as 5G NR, etc. The presence of such multiple RF transmissions originating from the device itself, as well as from other wireless devices in its vicinity, gives rise to potentially strong jammers that can interfere with accurate reception of a desired signal by the device. Accordingly, a radio receiver must be designed to accommodate such jammers, e.g., significantly attenuate or eliminate them, in the receive signal path.

Prior art techniques for jammer rejection include providing one or more passive filters in a radio receive signal path before a low-noise amplifier (LNA). Such an approach often requires surface mount device (SMD) inductors and increases circuit area and product cost. Another prior art technique includes designing certain frequency-selective properties into a feedback network of an LNA of the radio receiver. However, such an approach may cause instability in the receiver, and also negatively impact the receiver performance. Accordingly, there is a need to provide low-cost and effective techniques to provide jammer rejection for a radio receiver that do not suffer from the drawbacks of the prior art.

SUMMARY

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In accordance with an aspect of the disclosure, an amplifier is provided that includes: an input node and an output node; a first transistor and a second transistor, a gate of the first transistor being coupled to the input node, a first terminal of the first transistor being coupled to a ground, a second terminal of the first transistor being coupled to a first terminal of the second transistor, and a second terminal of the second transistor being coupled to the output node; a load circuitry coupled between a power supply and the second terminal of the second transistor; an inductor, a first terminal of the inductor being coupled to the ground through a first switch; and a capacitor, a first terminal of the capacitor being coupled to the first terminal of the second transistor and a second terminal of the capacitor being coupled to a second terminal of the inductor.

In accordance with another aspect of the disclosure, a low noise amplifier (LNA) is provided that includes: an input port and an output port; a first signal path coupled between the input port and the output port, the first signal path including: a first transistor coupled to the input port, a second transistor including a first terminal coupled to the first transistor and a second terminal coupled to the output port through a first switch, and a load circuitry coupled between a power supply of the LNA and the second terminal of the second transistor; a second signal path coupled between the input port and the output port, the second signal path including: an inductor including a first terminal coupled to the input port and a second terminal coupled to the output port through a second switch and coupled to a ground of the LNA through a third switch; and a capacitor coupled between the first terminal of the second transistor and the first terminal of the inductor.

In accordance with yet another aspect of the disclosure, an apparatus is provided that includes: means for amplifying a radio frequency (RF) signal having an input port, an output port, and a gain stage coupled between the input port and the output port; means for bypassing the means for amplifying configured to transmit the RF signal from the input port to the output port; and means for filtering having a capacitor coupled to the gain stage and sharing an inductor with the means for bypassing.

Finally, in accordance with another aspect of the disclosure, a method for using an amplifier providing a high gain mode and a low gain mode is provided that includes: accepting an input signal at an input node of the amplifier, the amplifier including a high gain path coupled between the input node and an output node of the amplifier, a low gain path coupled between the input node and the output node, and a notch filter coupled between the high gain path and a ground of the amplifier; and routing the input signal based at least in part on a selection of the high gain mode or the low gain mode, routing the input signal including performing at least one routing mode: a first routing mode in which the high gain mode is selected and a jammer is detected, including routing the input signal through the high gain path with the notch filter enabled; a second routing mode in which the high gain mode is selected and the jammer is not detected, including routing the input signal through the high gain path with the notch filter disabled; or a third routing mode in which the low gain mode is selected, including routing the input signal through the low gain path with the notch filter disabled.

Other aspects, features, and implementations of the present disclosure will become apparent to those of ordinary skill in the art, upon reviewing the following description of specific, exemplary implementations of the present disclosure in conjunction with the accompanying figures. While features of the present disclosure may be discussed relative to certain implementations and figures below, all implementations of the present disclosure can include one or more of the advantageous features discussed herein. In other words, while one or more implementations may be discussed as having certain advantageous features, one or more of such features may also be used in accordance with the various implementations of the disclosure discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various implementations and to explain various principles and advantages in accordance with the present disclosure.

DETAILED DESCRIPTION

Figure 1:
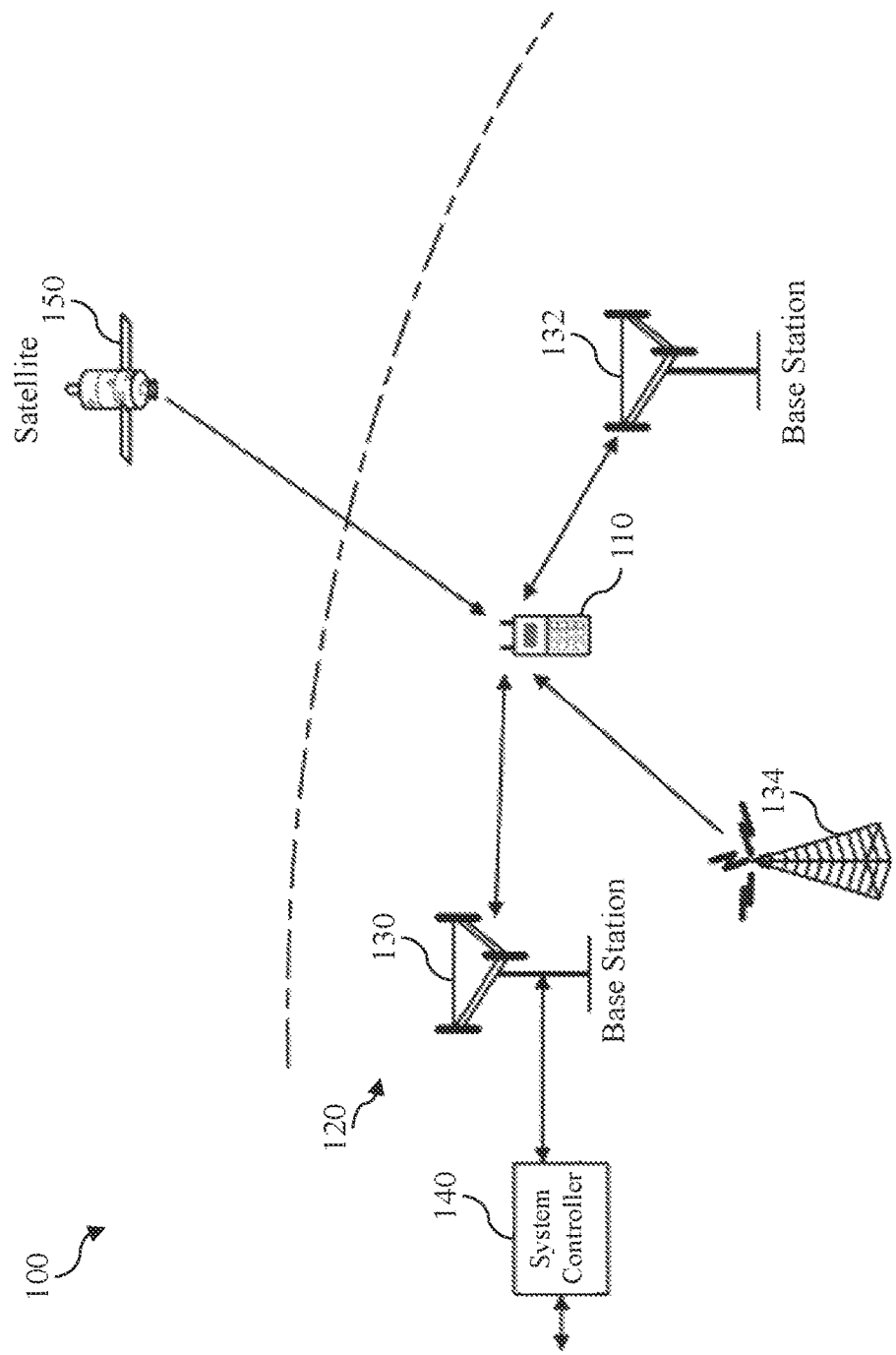
FIG. 1 illustrates a diagram depicting a wireless device communicating with a wireless communication system, in accordance with aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Communication devices may transmit and receive communication data through a communication medium. The electromagnetic spectrum is often subdivided, based on frequency/wavelength, into various classes, bands, channels, etc. In one example, the communication medium may be a wireless communication medium where communication data is transmitted and received by communication devices according to a wireless communication protocol. Example wireless communication protocols may include the IEEE 802.11 protocols (e.g., Wi-Fi), Bluetooth protocols according to the Bluetooth Special Interest Group, Long Term Evolution (LTE), and a fifth generation (5G) wireless communications technology (also referred to as 5G new radio (5G NR)). Wi-Fi communications may operate in either a frequency band centered around 2.4 GHz (e.g., 2.4G Wi-Fi communications) or a frequency band centered around 5 GHz (e.g., 5G Wi-Fi communications). LTE is a set of enhancements to the Universal Mobile Telecommunications System (UMTS) mobile standard promulgated by Third Generation Partnership Project (3GPP). LTE communications may operate in portions of the licensed frequency spectrum (e.g., between approximately 700 MHz-2.6 GHz; may be known as LTE-L) and may operate in portions of the unlicensed frequency spectrum (e.g., around 5 GHz; may be known as LTE-U). In 5G NR two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band. The frequencies between FR1 and FR2 are often referred to as mid-band (MB) frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4-a or FR4-1 (52.6 GHz-71 GHz), FR4 (52.6 GHz-114.25 GHz), and FR5 (114.25 GHz-300 GHz). Each of these higher frequency bands falls within the EHF band.

RF signals within the communication devices may undergo amplification during various processing operations. For example, an RF signal may be amplified when it is received from or transmitted to another communication device. In some cases, as an RF signal is amplified, an unwanted signal may be introduced (e.g., added) to the amplified signal. For example, when a communication device is configured for multi-band concurrent operation (e.g., to concurrently communicate with other devices using 5G NR signals and using 2.4G Wi-Fi/LTE-L signals), the transmission and/or reception of signals in one frequency band may interfere with the reception of signals in the other frequency band. For one instance, the 2.4G Wi-Fi/LTE-L signals may undesirably couple into the receive circuits used for the 5G NR signals, which degrades performance of the communication device. For another instance, a transmitting signal of one operating band in 5G NR (e.g., band 3 of mid-band frequencies, may be known as B3) may undesirably couple into the receive circuits at another operating band (e.g., band 77 of ultra-high band, may be known as n77).

According to aspects described herein, an amplifier with an integrated notch filter may be used to provide jammer rejection for a radio receiver. Instead of relying on large and costly off-chip filters, example implementations create an integrated notch filter to attenuate jammer signals that would otherwise cause interference at an output of an amplifier. Thus, an amplified signal with certain jammer immunity can be achieved with an amplifier using a smaller and less expensive approach to handling jammer interference.

While aspects and examples are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, aspects and/or uses may come about via integrated chip examples and other non-module-component-based devices (e.g., end-user devices, vehicles, communication devices, computing devices, industrial equipment, retail/ purchasing devices, medical devices, AI-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also necessarily include additional components and features for implementation and practice of claimed and described examples. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc., of varying sizes, shapes, and constitution.

The various concepts presented throughout this disclosure may be implemented across a broad variety of telecommunication systems, network architectures, and communication standards. Referring now to FIG. 1, as an illustrative example without limitation, various aspects of the present disclosure are illustrated with reference to a wireless communication system 100. The wireless communication system 100 includes a wireless device 110 communicating with a wireless communication system 120.

The wireless communication system 120 may implement any suitable wireless communication technology or technologies to provide radio access to the wireless device 110. As one example, the wireless communication system 120 may operate according to 3rd Generation Partnership Project (3GPP) New Radio (NR) specifications, often referred to as 5G. As another example, the RAN 104 may operate under a hybrid of 5G NR and Evolved Universal Terrestrial Radio Access Network (eUTRAN) standards, often referred to as Long Term Evolution (LTE). Of course, many other examples may be utilized within the scope of the present disclosure. For example, the wireless communication system 120 may be a 5G NR system, an LTE system, a Code Division Multiple Access (CDMA) system, a Global System for Mobile Communications (GSM) system, a wireless local area network (WLAN) system (e.g., a Wi-Fi system), or any other suitable wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows the wireless communication system 120 including two base stations 130 and 132 and one system controller 140. In general, a wireless system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may communicate with the wireless communication system 120. The wireless device 110 may also receive signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G NR, LTE, WCDMA, CDMA 1×, EVDO, TD-SCDMA, GSM, 802.11, etc.

Figure 2:
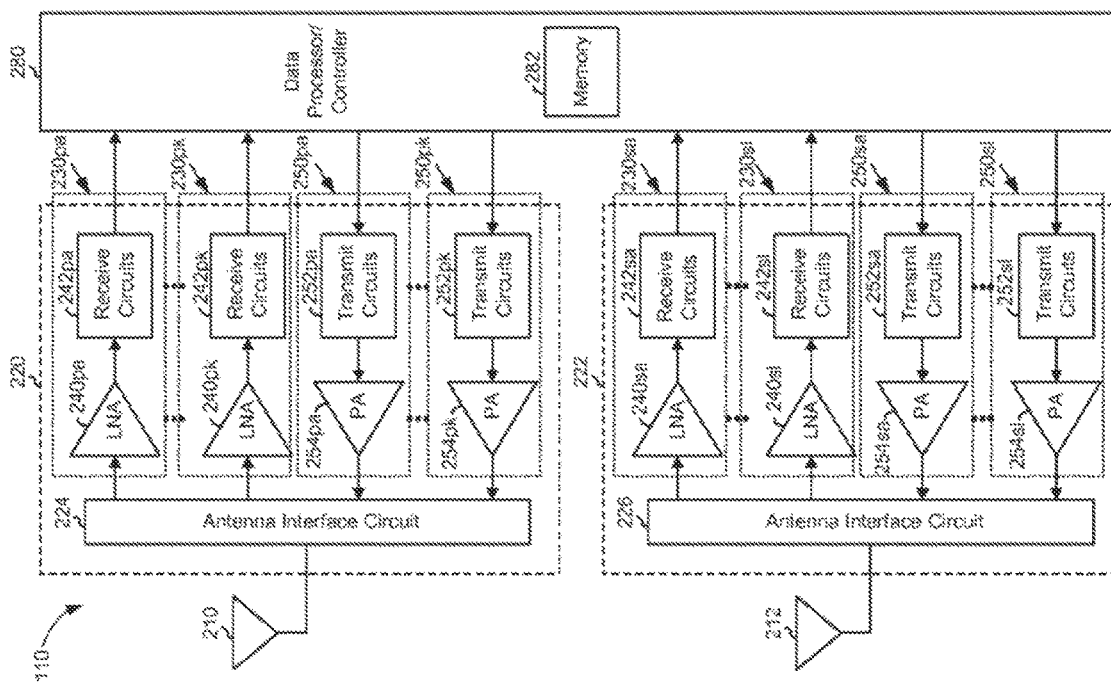
FIG. 2 illustrates a block diagram depicting an example wireless device, in accordance with aspects of the present disclosure.

FIG. 2 is a block diagram depicting an example wireless device 110, in accordance with some implementations. For the example of FIG. 2, the wireless device 110 is shown to include a primary transceiver 220 coupled to a primary antenna 210, a secondary transceiver 222 coupled to a secondary antenna 212, and a data processor/controller 280. The primary transceiver 220 includes a number (K) of receivers 230$pa$ to 230$pk$ and a number (K) of transmitters 250$pa$ to 250$pk$ to support multiple frequency bands, multiple radio technologies, carrier aggregation, transmit diversity, and/or multiple-input multiple-output (MIMO) communications. The secondary transceiver 222 includes a number (L) of receivers 230$sa$ to 230$s1$ and a number (L) of transmitters 250$sa$ to 250$s1$ to support multiple frequency bands, multiple radio technologies, carrier aggregation, receive diversity, and/or MIMO communications.

For the example of FIG. 2, each receiver 230 (e.g., 230$pa$-230$pk$ and 230$sa$-230$s1$) includes at least a low noise amplifier (LNA) 240 (e.g., 240$pa$-240$pk$ and 240$sa$-240$s1$) and a receive circuit 242 (e.g., 242$pa$-242$pk$ and 242$sa$-242$s1$). For data reception, the primary antenna 210 receives signals from base stations and/or other transmitter stations and provides a received radio frequency (RF) signal, which is routed through a primary antenna interface circuit 224 and presented as an input RF signal to a selected receiver. Primary antenna interface circuit 224 may include switches, duplexers, transmit filters, receive filters, matching circuits, and other suitable components or circuits. The description below assumes that the receiver 230$pa$ is the selected receiver. Within the receiver 230$pa$, an LNA 240$pa$ amplifies the input RF signal and provides an output RF signal. The receive circuit 242$pa$ may down-convert the output RF signal from RF to baseband, amplify and filter the down-converted signal, and provide an analog input signal to data processor/controller 280. The receive circuits 242$pa$ may include mixers, filters, amplifiers, an oscillator, a local oscillator (LO) generator, a phase locked loop (PLL), and other suitable components or circuits. Each remaining receiver 230$pa$ to 230$pk$ and 230$sa$ to 230$s1$ in the transceivers 220 and 222 may operate in similar manner as the receiver 230$pa$.

For the example of FIG. 2, each transmitter 250 (e.g., 250$pa$-250$pk$ and 250$sa$-250$s1$) includes at least a transmit circuit 252 (e.g., 252$pa$-252$pk$ and 252$sa$-252$s1$) and a power amplifier (PA) 254 (e.g., 254$pa$-254$pk$ and 254$sa$-254$s1$). For data transmission, the data processor/controller 280 processes (e.g., encodes and modulates) data to be transmitted and provides an analog output signal to a selected transmitter. The description below assumes that transmitter 250$pa$ is the selected transmitter. Within the transmitter 250$pa$, the transmit circuit 252$pa$ may amplify, filter, and up-convert the analog output signal from baseband to RF and provide a modulated RF signal. The transmit circuit 252$pa$ may include amplifiers, filters, mixers, matching circuits, an oscillator, an LO generator, a PLL, and other suitable components or circuits. A PA 254$pa$ receives and amplifies the modulated RF signal and provides a transmit RF signal having the proper output power level. The transmit RF signal is routed through antenna interface circuit 224 and transmitted via primary antenna 210. Each remaining transmitter 250 in the transceivers 220 and 222 may operate in similar manner as the transmitter 250$pa$. In a similar manner, secondary antenna interface circuit 226 may route RF signals between secondary antenna 212 and secondary LNA module 240s and/or secondary power amplifier module 254s.

Each receiver 230 and transmitter 250 may also include other circuits not shown in FIG. 2, such as filters, matching circuits, and/or other suitable components or circuits. All or a portion of the transceivers 220 and 222 may be implemented on one or more analog integrated circuits (ICs), RF ICs (RFICs), mixed-signal ICs, and other suitable ICs. For example, the LNAs 240 and the receive circuits 242 within the transceivers 220 and 222 may be implemented on multiple IC chips. The circuits in the transceivers 220 and 222 may also be implemented in other manners.

The data processor/controller 280 may perform various functions for the wireless device 110. For example, the data processor/controller 280 may perform processing for data being received via the receivers 230 and data being transmitted via the transmitters 250. The data processor/controller 280 may control the operations of the various circuits within the transceivers 220 and 222. A memory 282 may store program codes and data for the data processor/controller 280. The data processor/controller 280 may be implemented on one or more application specific integrated circuits (ASICs) and/or other ICs.

A feature of modern wireless devices is that multiple radios may operate simultaneously in a single device. The multiple transmissions caused by such simultaneous operation of multiple radios may create numerous strong jammer tones within the device. The jammer tones act as interference to the receiver portions of the device, potentially seriously degrading the receiver sensitivity and thus posing a challenge for the receiver design. For example, when Wi-Fi/LTE-L radios (e.g., in some implementations, the secondary transceiver 222) and 5G NR radios (e.g., in some implementations, the primary transceiver 220) operate together in a single device, the Wi-Fi/LTE-L transmit signal (e.g., transmitters 250sa-250s1) may act as an out-of-band (OOB) jammer to the 5G NR receive path (e.g., receivers 230pa-230 pk). In another example, among different bands of 5GF NR radios, Tx signal in one band (e.g., in some implementations, the secondary transceiver 222 as a mid-band (e.g., B3) transceiver) may act as a jammer to Rx signal in another band (e.g., in some implementations, the primary transceiver 220 as a UHB (e.g., n77) transceiver).

Such a jammer (or multiple jammers, when there are other radios) may undesirably desensitize the 5G NR receive signal path, due to at least the following mechanisms: 1) When other jammers are present along with OOB jammer at the input to the receiver, the subsequent down-conversion mixing stages may generate intermodulation products that lie at baseband frequencies, which undesirably desensitize the receiver; 2) Certain non-linear behavior of the receive circuitry, e.g., as quantified by second-order input intercept point (IIP2), may cause the jammer to be translated to baseband, further desensitizing the receiver. For example, the presence of OOB jammer at the receiver input may generate distortion components at baseband. 3) Various harmonics of the local oscillator (LO) may be present at the LO input to the mixer. Such LO harmonics may be mixed by the mixer with OOB jammer, which may translate the jammer down to baseband. Since in many implementations, the power of the LO harmonics can be very strong, strong reciprocal mixing products may be generated with even a weak OOB jammer signal. In view of the plurality of mechanisms by which one or more jammers may undesirably degrade receiver sensitivity, it would be desirable to significantly attenuate jammer strength, e.g., OBB Jammer and/or second-order or higher harmonics, prior to mixing with the LO in the receive signal path.

Figure 3:
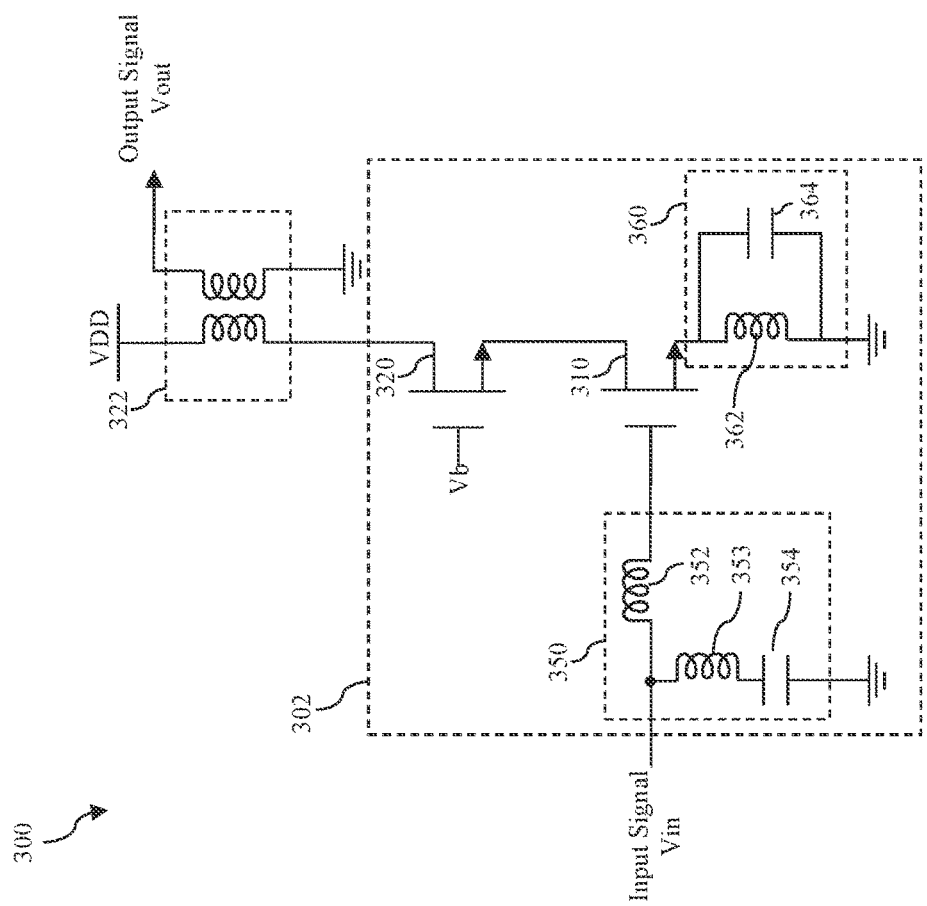
FIG. 3 illustrates a sample receiver portion incorporating various prior art techniques for dealing with jammers.

FIG. 3 illustrates a sample receiver portion 300, particularly a low noise amplifier (LNA), incorporating various prior art techniques for dealing with jammers. The sample receiver portion 300 includes an amplification stage 302 that includes an input transistor 310 coupled to a cascode transistor 320. The drain of the cascode transistor 320 supports the single-ended output voltage of the amplification stage 302, which is further transformed by transformer 322 into an output signal Vout. An input signal Vin to the amplification stage 302, e.g., as derived from an output of the antenna 210 of FIG. 2, is coupled to the gate of the input transistor 310 in series with a matching network or L-C filter configuration 350.

In an implementation, the L-C filter 350 may include a first inductor 352, a second inductor 353, and a capacitor 354, with values appropriately chosen to pass through desired received signal frequencies, while attenuating other frequencies, e.g., jammer frequencies. For example, since an OOB jammer is expected to lie outside (either higher or lower) the operating bands of the desired signal frequency, the matching network 350 can be relied on to provide some filtering of the OOB jammer. However, to provide sufficient attenuation of the OOB jammer, the inductors 352 and 353 are often in the form of a surface mount device (SMD) inductor for achieving high Q (quality factor). SMD inductors as off-chip components increase circuit dimensions and product cost. Further, when the OOB jammer is too strong, or when the jammer frequency is low, then to provide sufficient attenuation, more orders of filtering may be required beyond the first-order filtering provided by the matching network 350. This could result in more matching components and increased product cost.

In FIG. 3, the source of input transistor 310 is further coupled to an L-C filter 360, which includes an inductor 362 coupled in parallel with a capacitor 364. Similarly to the L-C filter 350, the inductor 362 and capacitor 364 of the L-C filter 360 may also be appropriately chosen to enhance amplifier gain at the desired received signal frequencies, and to attenuate amplifier gain at other frequencies, e.g., jammer frequencies. In particular, the capacitance value of the capacitor 364 may be tuned so that the resonant frequency of the LC combination 360 corresponds to the OOB jammer frequency, causing the source degeneration to have a high impedance at the jammer frequency, thus rejecting the jammer tone. However, it will be appreciated that providing the filter 360 at the source of input transistor 310 may undesirably cause instability of the amplification stage 302, due to the feedback effects generated thereby. To reduce the risk of instability, the capacitor 364 may be designed as a low Q (quality factor) device; however, this degrades the jammer rejection performance of the technique. Moreover, in some cases, the OOB jammer may be so strong in power that, despite implementing both the aforementioned approaches (e.g., providing both L-C networks 350 and 360), the receiver may still experience significant desensitization. Accordingly, there is a need for providing low-cost and effective techniques for attenuating jammers prior to the receiver down-conversion mixing.

Figure 4:
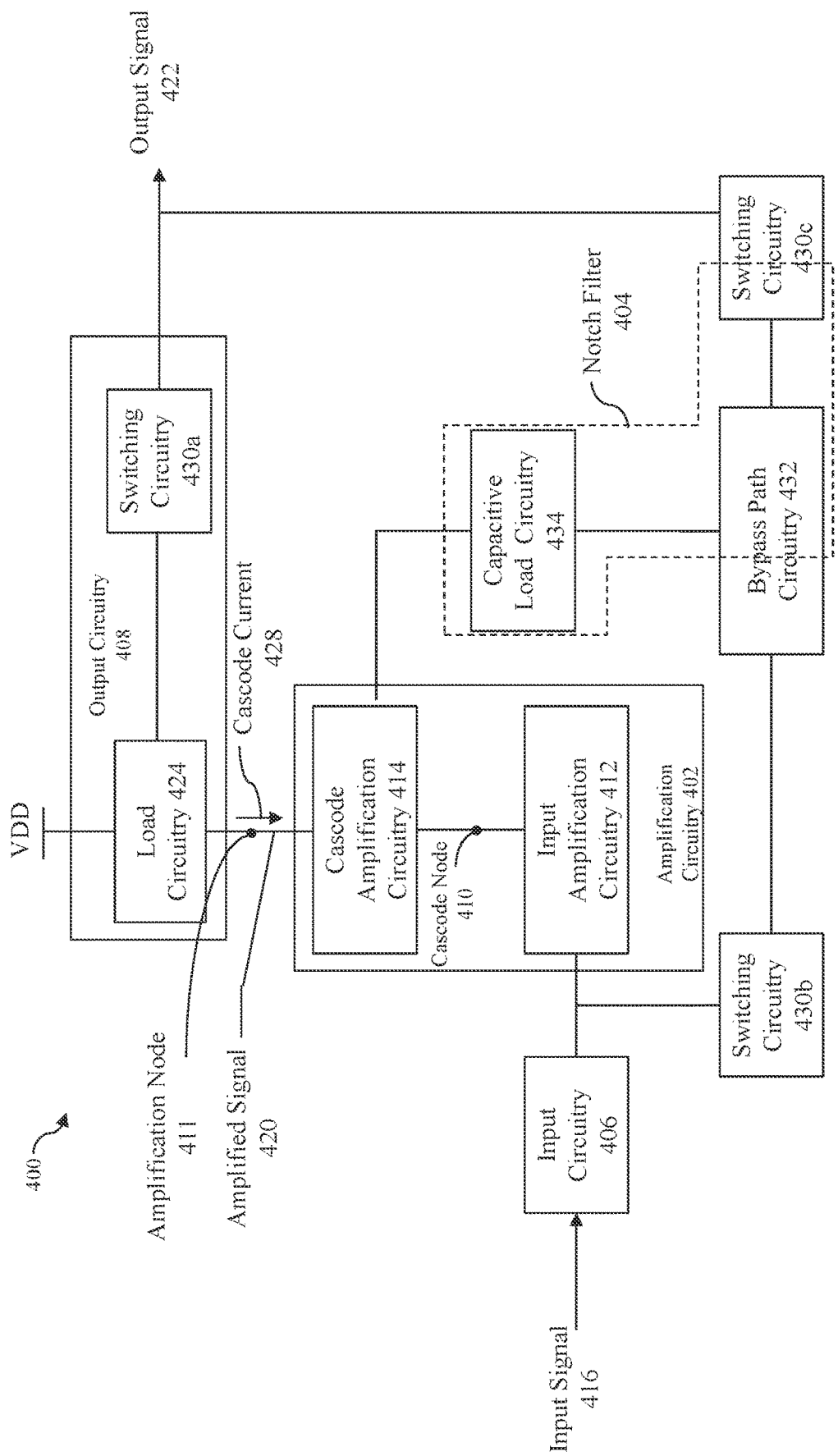
FIG. 4 is a schematic diagram illustrating an example amplifier with an integrated notch filter, in accordance with aspects of the present disclosure.

FIG. 4 is a schematic diagram illustrating an example amplifier 400 including amplification circuitry 402 and an associated notch filter 404 according to the present disclosure. As illustrated, the amplifier 400 also includes an input circuitry 406. The amplification circuitry 402 includes input amplification circuitry 412 and cascode amplification circuitry 414. The amplifier 400 may be part of a receiver 230 in FIG. 2. Particularly, the amplifier 400 may be a front-end LNA, such as the LNA 240 in FIG. 2. As part of a receive chain, the amplifier 400 receives an input signal 416 (e.g., an RF signal), amplifies the input signal 416, and forwards an amplified version of the input signal as the output signal 422.

In operation, the input circuit 406 accepts the input signal 416 and relays the input signal 416 to the input amplification circuitry 412. The input circuitry 406 can obtain the input signal 416 from an upstream component, such as a filter, a mixer, a converter unit, or an antenna. To do so, the input circuit 416 can include one or more components to provide impedance matching with the upstream component.

The amplification circuitry 402 amplifies the input signal 416 to produce an amplified signal 420. The amplification circuitry 402 provides the amplified signal 420 to the output circuit 408. The output circuit 408 accepts the amplified signal 420 and produces an output signal 422 based on the amplified signal 420. The output circuit 408 forwards the output signal 422 to a downstream component, such as a filter, a mixer, or a converter unit. To facilitate coupling to a downstream component, the output circuit 408 can include one or more components to provide impedance matching with the downstream component.

In some aspects, the amplifier 400 is implemented as a cascode amplifier having at least two levels: a first level with a transconductance part and a second level with a load part. For a two-level cascode amplifier, the first level includes input amplification circuitry 412, and the second level includes cascode amplification circuitry 414. The input amplification circuitry 412 is coupled in series with the cascode amplification circuitry 414 with a cascode node 410 disposed therebetween. The input amplification circuitry 412 is coupled between the input circuitry 406 and the cascode node 410. Thus, the input amplification circuitry 412 receives the input signal 416 from the input circuitry 406. The cascode amplification circuitry 414 is coupled between the cascode node 410 and the output circuit 408 with an amplification node 411 disposed therebetween. Thus, the cascode amplification circuitry 414 provides the amplified signal 420 to the output circuit 408.

In some aspects, the output circuitry 408 includes a load circuitry 424 and a switching circuitry 430a. The load circuitry 422 is coupled between a supply voltage (VDD) and the cascode amplification circuitry 414. The amplified signal 420 is generated based on the cascode current 428 flowing from VDD to ground through the load circuitry 422 and the amplification circuitry 402. The switching circuitry 430a is coupled between the load circuitry 422 and the output of the amplifier 400. When the switching circuitry 430a is closed, the input signal 416 travels through a high gain path, which includes the input circuitry 406, the amplification circuitry 402, and the output circuitry 408, and is amplified and forwarded to a downstream component as the output signal 422.

In some aspects, the amplifier 400 is implemented with a low gain path as well, which allows the input signal 416 bypasses the high gain path to arrive the output of the amplifier 400. The low gain path includes a switching circuitry 430b, a bypass path circuitry 432, and a switching circuitry 403c. The low gain path may also be referred to as a bypass path. The switching circuitry 430b is coupled between the output of the input circuitry 406 and the bypass path circuitry 432. The switching circuitry 430c is coupled between the bypass path circuitry 432 and the output of the amplifier 400. The bypass path circuitry 432 may include a bypass path inductor to provide signal conditioning. When the switching circuitry 430a is open, the switching circuitry 430b and the switching circuitry 430c are both closed to route the input signal 416 through the low gain path instead of the high gain path. Through the low gain path, the input signal 416 is routed to the output of the amplifier 400 without being substantially amplified (or amplified insignificantly compared to the high gain path).

When the high gain path is selected, the amplifier 400 is referred to as working under a high gain mode. When the low gain path is selected, the amplifier 400 is referred to as working under a low gain mode. The input signal 416, which can have an undesired frequency component such as an OOB jammer tone, is provided to the input amplification circuitry 412. Thus, under the high gain mode, without jammer rejection techniques, the amplification circuitry 402 may amplify the jammer tone, which may undesirably desensitize the receive chain. To combat the jammer tone, the amplifier 400 is integrated with a notch filter 404. In some aspects, the notch filter 404 includes an L-C circuit. The values of inductor and capacitor of the L-C circuit are appropriate chosen to have a resonant frequency corresponding to an OOB jammer frequency, thus providing effective rejection of the OBB jammer. Since the bypass path circuitry 432 already provides at least a bypass path inductor for signal conditioning along the low gain path, the notch filter 404 may reuse such an inductor to provide inductance in the L-C circuit without a need to rely on a separate inductor, such as an SMD inductor. In some implementations, the notch filter 404 includes a capacitive load circuitry 434 and reuses a portion of the bypass path circuitry 432 and a portion of the switching circuitry 430c. The capacitive load circuitry 434 is coupled between the amplification circuitry 402 and the bypass path circuitry 432 and provides capacitance to the L-C circuit. When the high gain path is disable and the low gain path is selected, the notch filter 404 is disabled and the bypass path inductor in the bypass path circuitry 432 continues providing signal conditioning along the low gain path. When the high gain path is selected, although the low gain path is disabled, the bypass path inductor in the bypass path circuitry 432 is reused in the notch filter 404 as part of the L-C circuit. Reusing the inductance in a low gain path for a notch filter provides an integrated and low-cost solution for jammer rejections.

Figure 5:
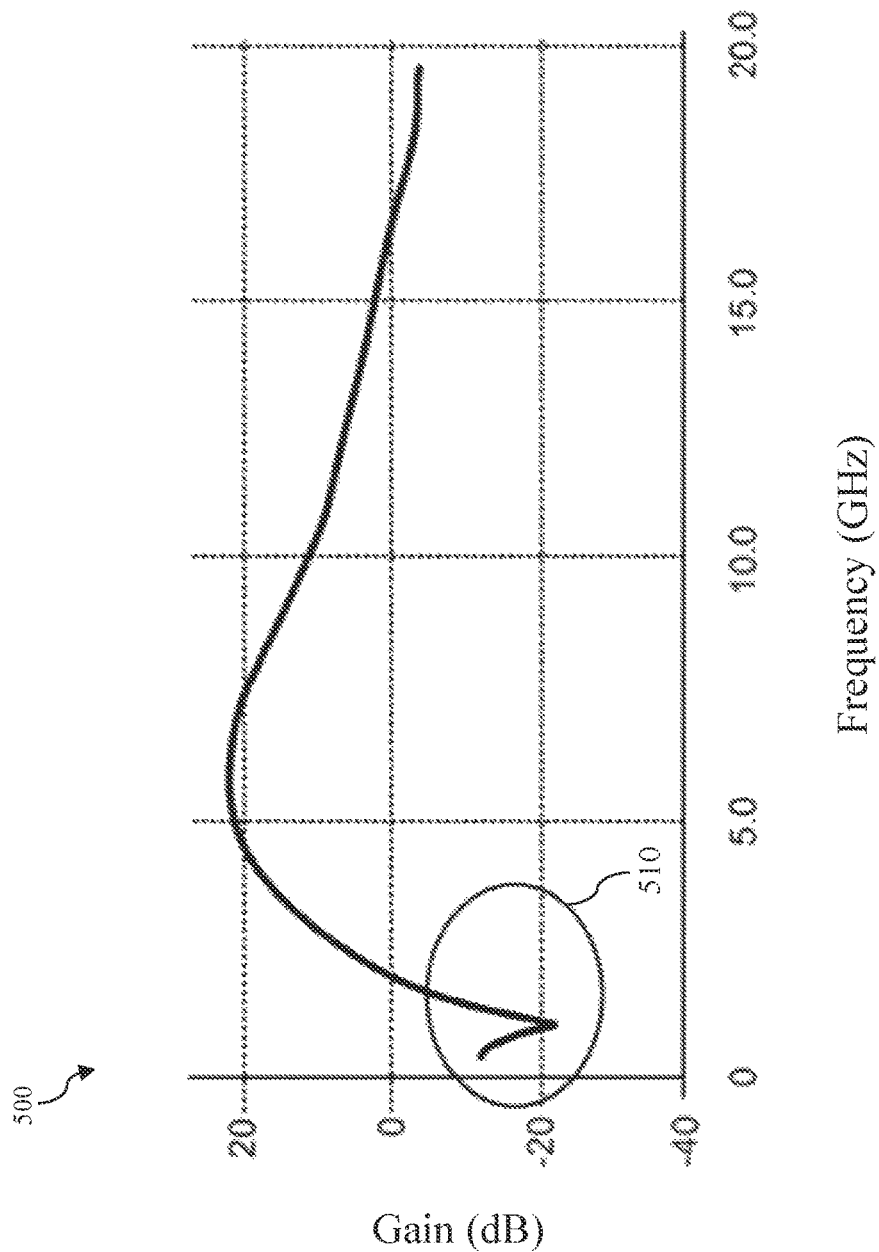
FIG. 5 illustrates an example frequency response of the amplifier of FIG. 4, in accordance with aspects of the present disclosure.

FIG. 5 shows an example frequency response 500 of the amplifier 400 of FIG. 4 under a high gain mode. Note FIG. 5 is provided for illustrative purposes only, and is not meant to limit the scope of the present disclosure to any particular type of frequency response shown. In FIG. 5, the Y-axis represents the gain of the amplifier 400 in decibels (dB), and the X-axis represents frequencies of the input signal in GHz. As described hereinabove, a notch 510 is introduced to the frequency response by the notch filter 404, representing attenuating frequencies of the input signal at a jammer frequency. Thus, the notch 510 serves to suppress the OOB jammer.

Figure 6:
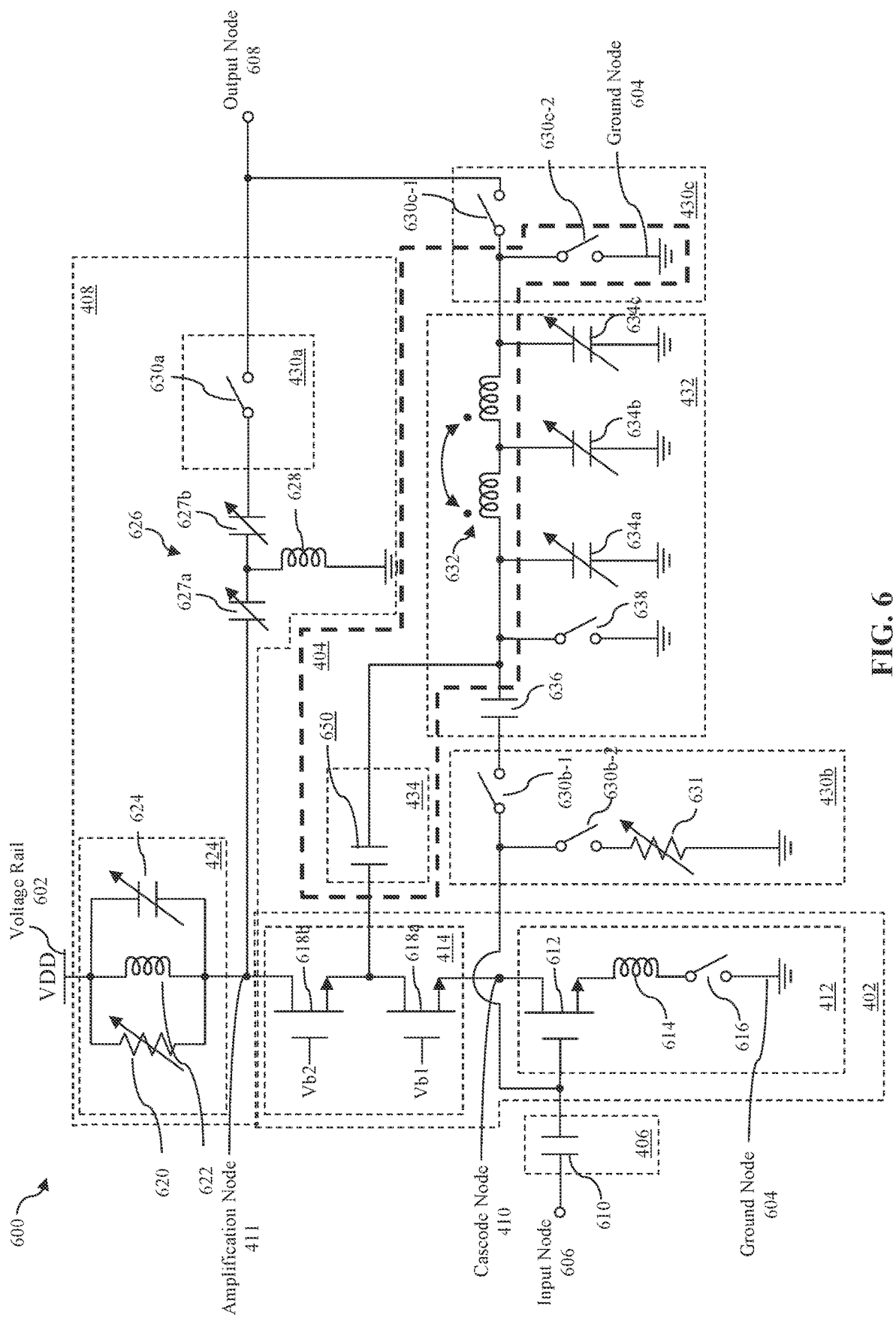
FIGS. 6, 7, and 8 are circuit diagrams representing different implementations of the amplifier of FIG. 4, in accordance with aspects of the present disclosure.

FIG. 6 is a circuit diagram depicting an example LNA 600 in accordance with some aspects of the present disclosure. The LNA 600 may be one implementation of the amplifier 400 of FIG. 4. The LNA 600 includes all the components of the amplifier 400 of FIG. 4 and illustrates examples of circuit-level components for the input amplification circuitry 412, cascode amplification circuitry 414, load circuitry 424, input circuitry 406, switching circuitries 430a/430b/430c, bypass path circuitry 432, and the notch filter 404. The circuit diagram 600 includes a voltage rail 602 (VDD), a ground node 604, an input node 606, and an output node 608.

In example implementations, the input circuitry 406 includes a capacitor 610. The input amplification circuitry 412 includes a gain transistor 612. The capacitor 610 is coupled between the input node 606 and the gate of the gain transistor 612. A degeneration inductor 614 is coupled between the source of the gain transistor 612 and the ground node 604 through a switch 616. The respective capacitive and inductive values of these components are selected to match an impedance of a component coupled to the input node 606 and in accordance with a frequency range of operation intended for the LNA 600. The switch 616 is closed (switched on) during the high gain mode, shorting one terminal of the degeneration inductor 614 to the ground node 604. The switch 616 may be open (switched off) during the low gain mode as the gain transistor 612 is bypassed under the low gain mode, which may improve linearity of the low gain mode.

The cascode amplification circuitry 414 includes at least one cascode transistor 618. As illustrated, the cascode amplification circuitry 414 includes a first cascode transistor 618a and a second cascode transistor 618b. The second cascode transistor 618b, the first cascode transistor 618a, the gain transistor 612, the degeneration inductor 614, and the switch 616 are coupled in series between the load circuitry 424 and the ground node 604. More specifically, the second cascode transistor 618b includes a drain coupled to the load circuitry 424, a gate to receive a cascode bias voltage Vb2, and a source coupled to a drain of the first cascode transistor 618a. The cascode bias voltage Vb2 may be used to set and/or adjust a gain of the second cascode transistor 618b. The first cascode transistor 618a includes a drain coupled to the source of the second cascode transistor 618b, a gate to receive a cascode bias voltage Vb1, and a source coupled to a drain of the gain transistor 612. The cascode bias voltage Vb1 may be used to set and/or adjust a gain of the first cascode transistor 618a.

For some implementations, the gain transistor 612 and/or the cascode transistors 618 may be N-type metal-oxide-semiconductor (NMOS) transistors, as depicted in FIG. 6. For other implementations, the gain transistor 612 and/or the cascode transistor 618 may be any suitable type of transistor including (but limited to) PMOS transistors, CMOS transistors, field-effect transistors (FETs), and bipolar transistors.

Figure 9:
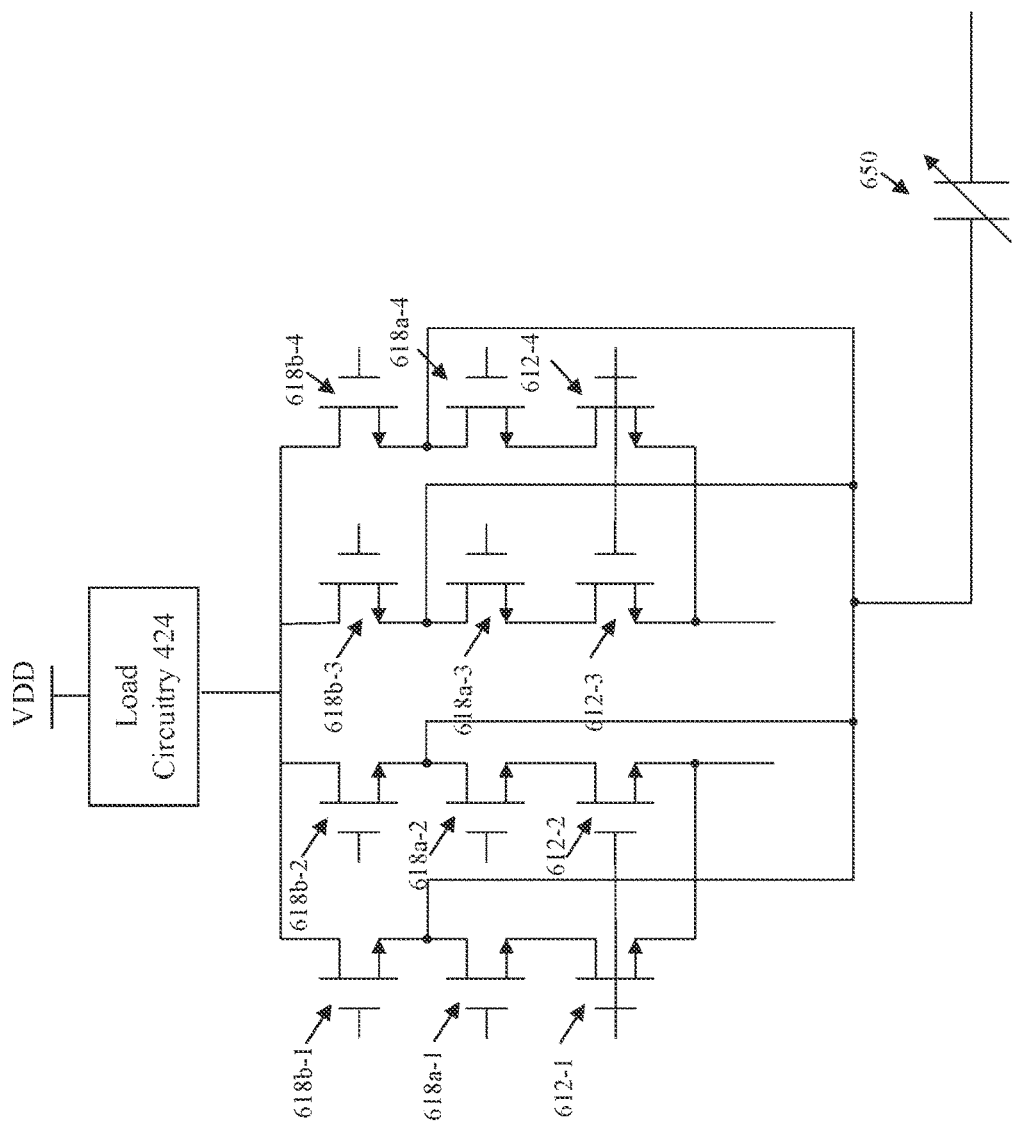
FIG. 9 illustrates an alternative implementation of a portion of the circuit diagram of FIG. 6, in accordance with aspects of the present disclosure.

As illustrated, the amplification circuitry 402 includes a single cascode amplification branch with a single-ended input. The cascode amplification branch includes the gain transistor 612, the first cascode transistor 618a, and the second cascode transistor 618b. However, the amplification circuitry 402 can be built with more than one cascode amplification branches. Referring to FIG. 9, an example implementation may include four cascode amplification branches. The first cascode amplification branch includes the gain transistor 612-1, the first cascode transistor 618a-1, and the second cascode transistor 618b-1 coupled in series. The second cascode amplification branch includes the gain transistor 612-2, the first cascode transistor 618a-2, and the second cascode transistor 618b-2 coupled in series. The third cascode amplification branch includes the gain transistor 612-3, the first cascode transistor 618a-3, and the second cascode transistor 618b-3 coupled in series. The fourth cascode amplification branch includes the gain transistor 612-4, the first cascode transistor 618a-4, and the second cascode transistor 618b-4 coupled in series. Further, the amplification circuitry 402 with multiple cascode amplification branches may receive differential input. Still referring to FIG. 9, the first and second cascode amplification branches may receive input from one end of a differential input signal, and the third and fourth cascode amplification branches may receive input from another end of the differential input signal.

Referring back to FIG. 6, with regard to the load circuitry 424, an adjustable resistor 620, a shunt inductor 622, and a variable capacitor 624 are coupled in parallel between the voltage rail 602 and the cascode amplification circuitry 414. The components of the load circuitry 424 may provide impedance-matching with a component that is adjacent to the LNA 600 and can have values set in accordance with an operational frequency range of interest. The amplification node 411 is coupled to the switching circuitry 430a through an RF filter 626 that includes two variable capacitors 627a/627b and an inductor 628 tapped therebetween. The values of the components in the RF filter 626 are set in accordance with an operational frequency range of interest. With regard to the switching circuitry 430a, a switch 630a is coupled between the RF filter 626 and the output node 608. The switch 630a may be an integrated on-chip RF switch.

In the low gain path, the switching circuitry 430b includes a switch 630b-1 coupled between the gate of the gain transistor 612 and the bypass path circuitry 432. The switching circuitry 430b further includes another switch 630b-2 and an adjustable resistor 631 coupled in series between the gate of the gain transistor 612 and the ground node 604. The resistance value of the adjustable resistor 631 can be adjusted to provide impedance-matching, such as for trading noise figure to linearity. Each of the switches 630b-1 and 630b-2 may be an integrated on-chip RF switch.

In the low gain path, the bypass path circuitry 432 includes an integrated on-chip inductor 632 with a center tap coupled to a variable capacitor 634b. The two terminals of the inductor 632 are coupled to the ground node 604 through variable capacitors 634a and 634c, respectively. The inductor 632, together with the variable capacitors 634a-c, provides signal conditioning along the low gain path. The respective inductive and capacitive values of these components are selected to provide suitable signal conditioning in accordance with a frequency range of operation intended for the LNA 600. The bypass path circuitry 432 also includes a capacitor 636 coupled between the switch 630b-1 and the inductor 632. The capacitor 636 blocks DC current from flowing into the low gain path. The bypass path circuitry 432 further includes a switch 638 coupled between the inductor 632 and the ground node 604. Th switch 638 may be an integrated on-chip RF switch. The switch 638 may be closed when the LNA 600 is disabled and remain open in other working modes including high gain mode and low gain mode.

Still in the low gain path, the switching circuitry 430c includes a switch 630c-1 coupled between the inductor 632 and the output node 608. The switching circuitry further includes another switch 630c-2 coupled between the inductor 632 and the ground node 604. Each of the switches 630c-1 and 630c-2 may be an integrated on-chip RF switch. Under the low gain mode, the switch 630c-1 is closed and the switch 630c-2 is open, routing input signal through the low gain path to the output node 608. Under the high gain mode, the switch 630c-1 is open and the switch 630c-2 may be closed, terminating the low gain path to the ground node 604.

With respect to the notch filter 404, the capacitive load circuitry 434 in the example implementation includes a capacitor 650 coupled to the input terminal of the inductor 632, providing capacitance to the L-C circuit of the notch filter 404. When the switch 630c-1 is open and the switch 630c-2 is closed, the capacitor 650 and the inductor 632 is coupled in series between the source of the second cascode transistor 618b (drain of the first cascode transistor 618a) and the ground node 604. The notch filter frequency is determined by the total effective inductance (Leff) of the inductor 632 and the capacitance C of the capacitor 650 using the formula below:

$$F_{notch} = \frac{1}{2\pi\sqrt{L_{eff} \times C}}$$

The total effective inductance (Leff) is the effective inductance which includes the intrinsic and mutual inductance of inductor 632. In the illustrated implementation, the capacitor 650 is a fixed capacitor (e.g., having a fixed or predetermined capacitance). For other implementations, the capacitor 650 may be a variable capacitor, such as the variable capacitor 650 as shown in FIG. 9. The variable capacitor may include a control terminal to receive a tuning signal. The tuning signal may be used to set and/or adjust a capacitance of the variable capacitor to a desired level, which in turn may set and/or adjust the notch frequency range of the notch filter 404. The formed notched filter 420 is used to attenuate frequencies of the input signal that fall within the notch frequency range. That is, in the example frequency response 500 as shown in FIG. 5, the notch 510 may be tunable along the X-axis upon application needs.

Referring back to FIG. 6, the capacitor 650 and the inductor 632 are in series connection with the switch 630c-2, forming a notch filtering path for filtering jammers to the ground node 604. The resistance of the switch 630c-2 increases the resistivity of the notch filtering path. Generally, lower resistivity of the notching filtering path provides better notch filtering performance. One way to lower resistivity of an RF switch is to increase its layout area. Accordingly, in some implementations, the switch 630c-2 may have a lower resistance and larger layout area than other switches 630a, 630b-1, 630b-2, 630c-1, and 638.

Figure 7:
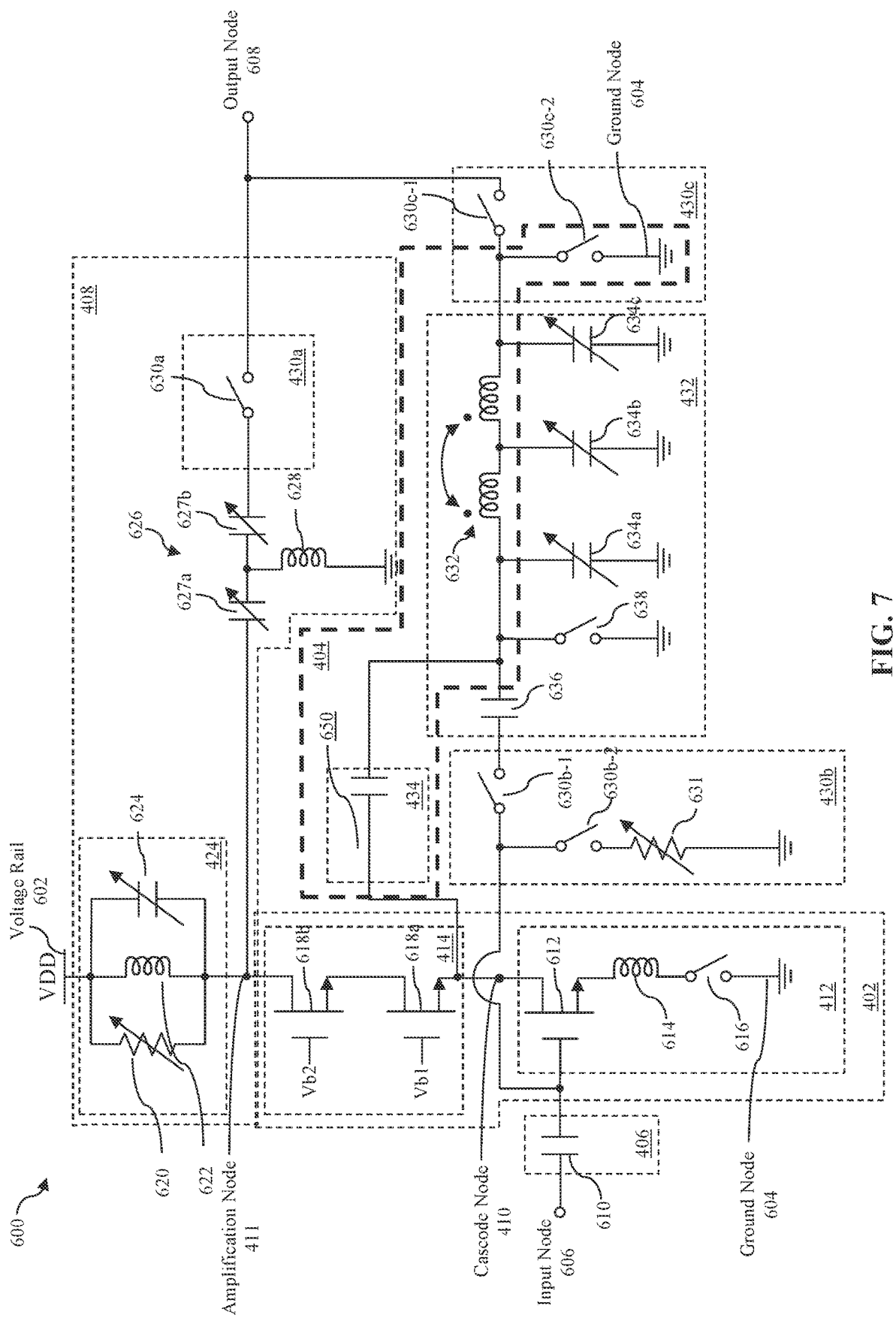

In the illustrated implementation in FIG. 6, the capacitor 650 is coupled to the source of the second cascode transistor 618b, while other implementations are possible. Referring to FIG. 7, as in an alternative implementation of the LNA 600, the capacitor 650 may be coupled to the source of the first cascode transistor 618a (drain of the gain transistor 612). That is, the capacitor 650 is connected to the cascode node 410. As many aspects of the circuit diagrams in FIGS. 6 and 7 are the same, they are not repeated below in the interest of conciseness and reference numerals are repeated for ease of understanding.

Figure 8:
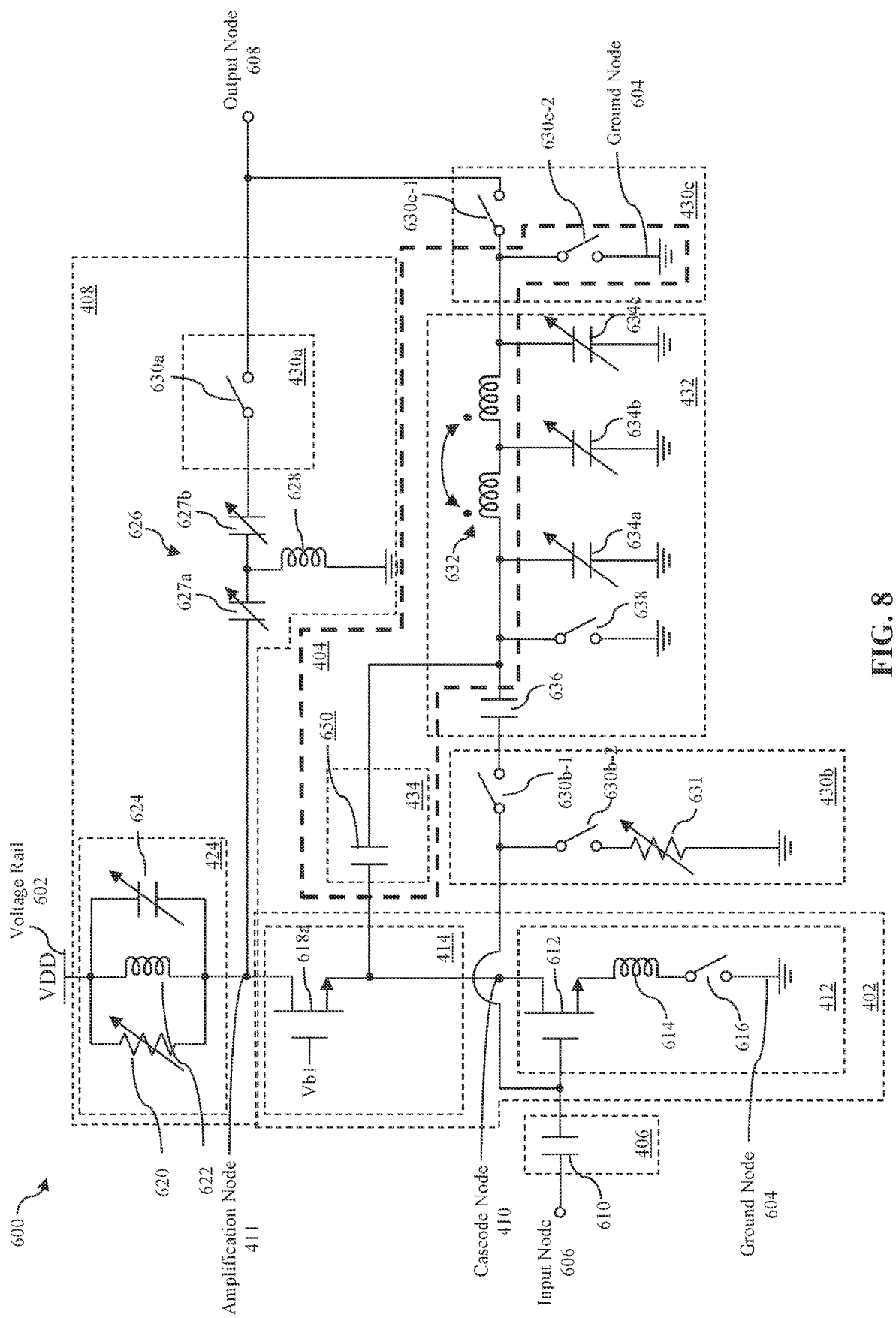

Also in the illustrated implementation in FIG. 6, the cascode amplification circuitry 414 includes two cascode transistors 618, while other implementations are possible. Referring to FIG. 8, as in an alternative implementation of the LNA 600, the cascode amplification circuitry 414 may include a single cascode transistor 618a and the capacitor 650 is coupled to the source of the cascode transistor 618a (drain of the gain transistor 612). As many aspects of the circuit diagrams in FIGS. 6 and 8 are the same, they are not repeated below in the interest of conciseness and reference numerals are repeated for ease of understanding.

Figure 10:
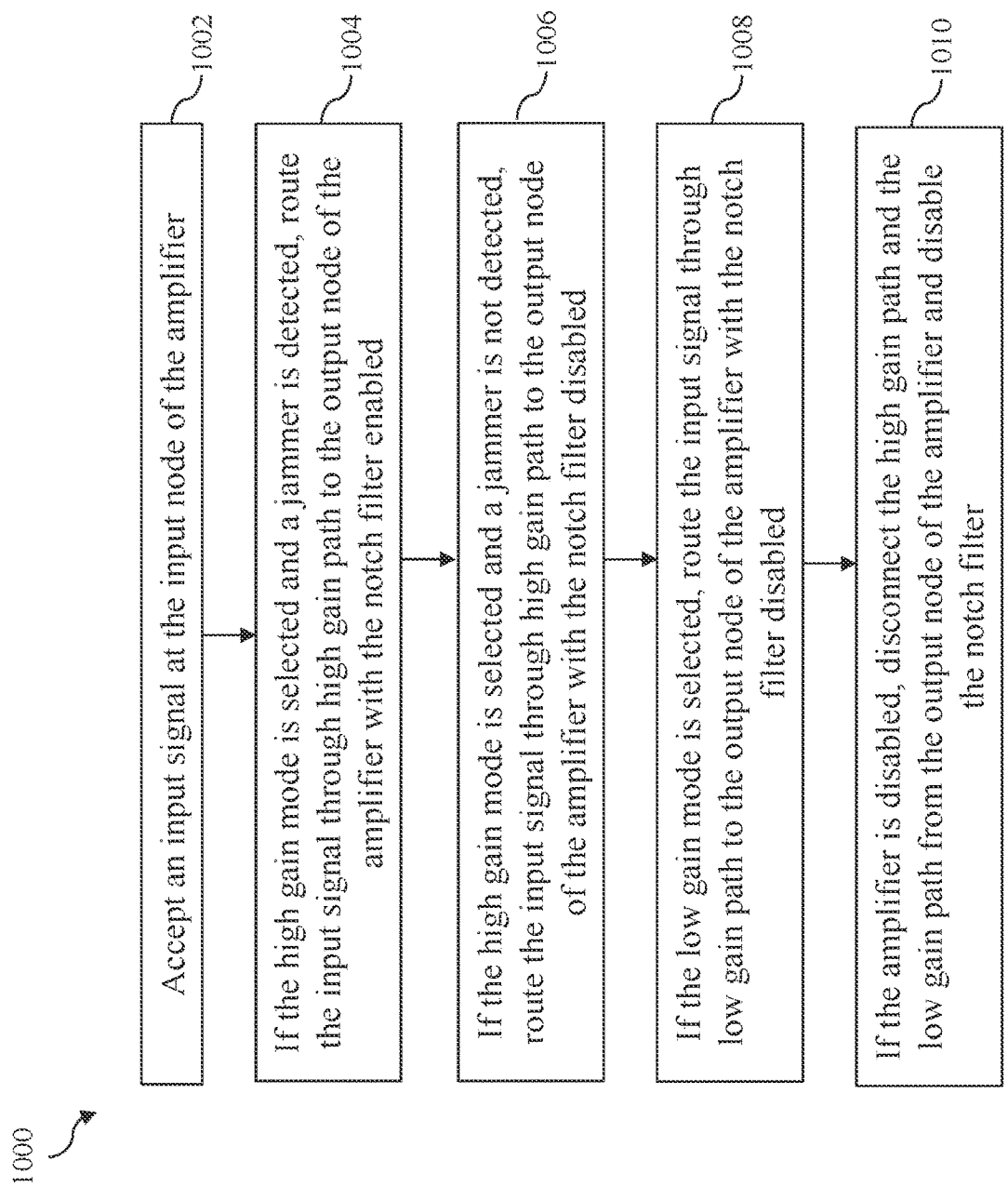
FIG. 10 is a flow chart depicting an example operation for operating an amplifier, in accordance with aspects of the present disclosure.

FIG. 10 is a flow diagram illustrating an example process 1000 for amplification with jammer rejection using an integrated notch filter. The process 1000 is described in the form of a set of blocks 1002-1010 that specify operations that may be performed. However, operations are not necessarily limited to the order shown in FIG. 10 or described herein, for the operations may be implemented in alternative orders or in fully or partially overlapping manners. Operations represented by the illustrated blocks of the process 1000 may be performed by an amplifier, such as the one represented at least partially by the schematic diagram in FIG. 4. More specifically, the operations of the process 1000 may be performed by an LNA, such as the one represented at least partially by the circuit diagram in one of FIGS. 6, 7, and 8.

At block 1002, an input signal is accepted at the input node of the amplifier. For example, the input circuitry 406 can accept an input signal relayed from an upstream component, such as a filter, a mixer, a converter unit, or an antenna. The input signal can generate an input voltage at the gate of the gain transistor 612.

At block 1004, if the high gain mode is selected, the switch 630a is closed, the switch 630c-1 is open, the switch 630b-1 is open, and the switch 638 is open. Accordingly, the high gain path including the input amplification circuitry 412, the cascode amplification circuitry 414, and the load circuitry 424 is coupled to the output node 608, and the low gain path is disconnected from the output node 608. If the notch filter 404 is enabled, for example, by receiving an enabling signal from a jammer detector in the receive chain when a jammer is detected, the switch 630c-2 is closed, providing a notch filtering path through the capacitor 650 and the inductor 632 to the ground node 604. The input signal is amplified and output to the output node 608 with frequencies attenuated at the notch frequency band of the notch filter 404.

At block 1006, if the high gain mode is selected, the switch 630a is closed, the switch 630c-1 is open, the switch 630b-1 is open, and the switch 638 is open. Accordingly, the high gain path including the input amplification circuitry 412, the cascode amplification circuitry 414, and the load circuitry 424 is coupled to the output node 608, and the low gain path is disconnected from the output node 608. If the notch filter 404 is disabled, for example, by receiving a disabling signal from a jammer detector in the receive chain when no jammer is detected, the switch 630c-2 is open, disconnecting the notch filter 404 from the ground node 604. The input signal is amplified and output to the output node 608 without frequencies attenuated at the notch frequency band of the notch filter 404.

At block 1008, if the low gain mode is selected, the switch 630a is open, the switch 630c-1 is close, the switch 630b-1 is close, the switch 638 is open, and the switch 630c-2 is open. Accordingly, the high gain path is disconnected from the output node 608, and the low gain path including the inductor 632 and associated capacitors is coupled to the output node 608. Since the switch 630c-2 is open, the notch filter 404 is disconnected from the ground node 604 and disabled. The inductor 632 does not function in the notch filter 404 but serves as a bypass path inductor in the low gain path for signal conditioning. The input signal is routed to the output node 608 through the inductor 632 without being amplified (or amplified insignificantly compared to the high gain path).

At block 1010, if the amplifier is disabled, the switch 630a is open, the switch 630c-1, and the switch 630b-1 is open, such that the high gain path and the low gain path are both disconnected from the output node 608. Further, the switch 630c-2 is open and the switch 638 is closed, such that the capacitor 650 is terminated to the ground node 604 and the notch filter 404 is disabled.

The disclosure will now be summarized in the following example clauses.

Clause 1. An amplifier comprising:
  an input node and an output node;
  a first transistor and a second transistor, wherein a gate of the first transistor is coupled to the input node, a first terminal of the first transistor is coupled to a ground, a second terminal of the first transistor is coupled to a first terminal of the second transistor, and a second terminal of the second transistor is coupled to the output node;
  a load circuitry coupled between a power supply and the second terminal of the second transistor;
  an inductor, wherein a first terminal of the inductor is coupled to the ground through a first switch; and
  a capacitor, wherein a first terminal of the capacitor is coupled to the first terminal of the second transistor and a second terminal of the capacitor is coupled to a second terminal of the inductor.

Clause 2. The amplifier of clause 1, wherein the second terminal of the inductor is coupled to the input node.

Clause 3. The amplifier of clauses 1-2, further comprising:
  a second switch, wherein the first terminal of the inductor is coupled to the output node through the second switch.

Clause 4. The amplifier of clause 3, further comprising:
  a third switch, wherein the second terminal of the second transistor is coupled to the output node through the third switch.

Clause 5. The amplifier of clause 3, wherein the first switch has a larger layout area than the second switch.

Clause 6. The amplifier of clauses 1-5, further comprising:
  a third transistor, wherein the second terminal of the first transistor is coupled to the first terminal of the second transistor through the third transistor.

Clause 7. The amplifier of clauses 1-6, further comprising:
  a third transistor, wherein the second terminal of the second transistor is coupled to the load circuitry through the third transistor.

Clause 8. The amplifier of clauses 1-7, further comprising:
  a second switch, wherein the second terminal of the capacitor and the second terminal of the inductor are coupled to the ground through the second switch.

Clause 9. The amplifier of clauses 1-8, wherein the capacitor is a variable capacitor.

Clause 10. The amplifier of clauses 1-9, further comprising:
  a variable capacitor, wherein the variable capacitor is coupled between a center tap of the inductor and the ground.

Clause 11. A low noise amplifier (LNA) comprising:
  an input port and an output port;
  a first signal path coupled between the input port and the output port, the first signal path including:
    a first transistor coupled to the input port,
    a second transistor including a first terminal coupled to the first transistor and a second terminal coupled to the output port through a first switch;
    a load circuitry coupled between a power supply of the LNA and the second terminal of the second transistor;
  a second signal path coupled between the input port and the output port, the second signal path including:
    an inductor including a first terminal coupled to the input port and a second terminal coupled to the output port through a second switch and coupled to a ground of the LNA through a third switch; and
    a capacitor coupled between the first terminal of the second transistor and the first terminal of the inductor.

Clause 12. The LNA of clause 11, wherein the first signal path has a higher gain than the second signal path.

Clause 13. The LNA of clauses 11-12, wherein the third switch has a smaller resistance than either of the first switch and the second switch.

Clause 14. The LNA of clauses 11-13, wherein the third switch has a larger layout area than either of the first switch and the second switch.

Clause 15. The LNA of clauses 11-14, further comprising:
  a fourth switch, wherein the first terminal of the inductor is coupled to the input port through the fourth switch.

Clause 16. The LNA of clause 15, further comprising:
  a fifth switch, wherein the first terminal of the inductor is coupled to the ground through the fifth switch.

Clause 17. The LNA of clauses 11-16, wherein the first signal path further includes:
  a third transistor, wherein the third transistor is coupled between the first transistor and the second transistor.

Clause 18. The LNA of clauses 11-17, wherein the first signal path further includes:
  a third transistor, wherein the third transistor is coupled between the load circuitry and the second transistor.

Clause 19. The LNA of clauses 11-18, wherein the capacitor is a first capacitor, wherein the inductor includes a first inductive component and a second inductive component, and wherein the second signal path further includes:
  a second capacitor coupled between the ground and a center tap between the first and second inductive components.

Clause 20. The LNA of clauses 11-19, wherein the capacitor is a tunable capacitor.

Clause 21. An apparatus comprising:
  means for amplifying a radio frequency (RF) signal having an input port, an output port, and a gain stage coupled between the input port and the output port;
  means for bypassing the means for amplifying configured to transmit the RF signal from the input port to the output port; and
  means for filtering having a capacitor coupled to the gain stage and sharing an inductor with the means for bypassing.

Clause 22. The apparatus of clause 21, wherein the means for amplifying provides a higher gain to the RF signal than the means for bypassing.

Clause 23. The apparatus of clauses 21-22, wherein the capacitor and the inductor are coupled in series to a ground of the apparatus.

Clause 24. The apparatus of clause 23, wherein the capacitor and the inductor are coupled in series to the ground of the apparatus through a switch.

Clause 25. The apparatus of clauses 21-24, wherein the gain stage includes an input amplification circuitry and a cascode amplification circuitry.

Clause 26. The apparatus of clause 25, wherein the input amplification circuitry includes a gain transistor and the cascode amplification circuitry includes at least a cascode transistor.

Clause 27. The apparatus of clause 25, wherein the capacitor is coupled to a cascode node disposed between the input amplification circuitry and the cascode amplification circuitry.

Clause 28. A method of using an amplifier providing a high gain mode and a low gain mode, comprising:
accepting an input signal at an input node of the amplifier, wherein the amplifier includes a high gain path coupled between the input node and an output node of the amplifier, a low gain path coupled between the input node and the output node, and a notch filter coupled between the high gain path and a ground of the amplifier; and
routing the input signal based at least in part on a selection of the high gain mode or the low gain mode, wherein routing the input signal includes performing at least one routing mode:
a first routing mode in which the high gain mode is selected and a jammer is detected, including routing the input signal through the high gain path with the notch filter enabled;
a second routing mode in which the high gain mode is selected and the jammer is not detected, including routing the input signal through the high gain path with the notch filter disabled; or
a third routing mode in which the low gain mode is selected, including routing the input signal through the low gain path with the notch filter disabled.

Clause 29. The method of clause 28, wherein the amplifier includes a first switch, a second switch, and a third switch, wherein the first switch is coupled between the high gain path and the output node, the second switch is coupled between the low gain path and the output node, and the third switch is coupled between the notch filter and the ground.

Clause 30. The method of clause 29, wherein:
in the first routing mode the first switch is closed, the second switch is open, and the third switch is closed;
in the second routing mode the first switch is closed, the second switch is open, and the third switch is open; and
in the third routing mode the first switch is open, the second switch is closed, and the third switch is open.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the disclosure.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the disclosed embodiments. Various modifications to these exemplary aspects will be readily apparent to those skilled in the art, and the generic principles defined herein may be applied to other exemplary aspects without departing from the spirit or scope of the disclosed embodiments. Thus, the present disclosure is not intended to be limited to the exemplary aspects shown herein but is to be accorded the widest scope consistent with the principles and novel features disclosed herein.

What is claimed is:

1. An amplifier comprising:
an input node and an output node;
a first transistor and a second transistor, wherein a gate of the first transistor is coupled to the input node, a first terminal of the first transistor is coupled to a ground, a second terminal of the first transistor is coupled to a first terminal of the second transistor, and a second terminal of the second transistor is coupled to the output node;
a load circuitry coupled between a power supply and the second terminal of the second transistor;
an inductor, wherein a first terminal of the inductor is coupled to the ground through a first switch; and
a capacitor, wherein a first terminal of the capacitor is coupled to the first terminal of the second transistor and a second terminal of the capacitor is coupled to a second terminal of the inductor.

2. The amplifier of claim 1, wherein the second terminal of the inductor is coupled to the input node.

3. The amplifier of claim 1, further comprising:
a second switch, wherein the first terminal of the inductor is coupled to the output node through the second switch.

4. The amplifier of claim 3, further comprising:
a third switch, wherein the second terminal of the second transistor is coupled to the output node through the third switch.

5. The amplifier of claim 3, wherein the first switch has a larger layout area than the second switch.

6. The amplifier of claim 1, further comprising:
a third transistor, wherein the second terminal of the first transistor is coupled to the first terminal of the second transistor through the third transistor.

7. The amplifier of claim 1, further comprising:
a third transistor, wherein the second terminal of the second transistor is coupled to the load circuitry through the third transistor.

8. The amplifier of claim 1, further comprising:
a second switch, wherein the second terminal of the capacitor and the second terminal of the inductor are coupled to the ground through the second switch.

9. The amplifier of claim 1, wherein the capacitor is a variable capacitor.

10. The amplifier of claim 1, further comprising:
a variable capacitor, wherein the variable capacitor is coupled between a center tap of the inductor and the ground.

11. A low noise amplifier (LNA) comprising:
an input port and an output port;
a first signal path coupled between the input port and the output port, the first signal path including:
a first transistor coupled to the input port,
a second transistor including a first terminal coupled to the first transistor and a second terminal coupled to the output port through a first switch;
a load circuitry coupled between a power supply of the LNA and the second terminal of the second transistor;
a second signal path coupled between the input port and the output port, the second signal path including:
an inductor including a first terminal coupled to the input port and a second terminal coupled to the output port through a second switch and coupled to a ground of the LNA through a third switch; and
a capacitor coupled between the first terminal of the second transistor and the first terminal of the inductor.

12. The LNA of claim 11, wherein the first signal path has a higher gain than the second signal path.

13. The LNA of claim 11, wherein the third switch has a smaller resistance than either of the first switch and the second switch.

14. The LNA of claim 11, wherein the third switch has a larger layout area than either of the first switch and the second switch.

15. The LNA of claim 11, further comprising:
a fourth switch, wherein the first terminal of the inductor is coupled to the input port through the fourth switch.

16. The LNA of claim 15, further comprising:
a fifth switch, wherein the first terminal of the inductor is coupled to the ground through the fifth switch.

17. The LNA of claim 11, wherein the first signal path further includes:
a third transistor, wherein the third transistor is coupled between the first transistor and the second transistor.

18. The LNA of claim 11, wherein the first signal path further includes:
a third transistor, wherein the third transistor is coupled between the load circuitry and the second transistor.

19. The LNA of claim 11, wherein the capacitor is a first capacitor, wherein the inductor includes a first inductive component and a second inductive component, and wherein the second signal path further includes:
a second capacitor coupled between the ground and a center tap between the first and second inductive components.

20. The LNA of claim 11, wherein the capacitor is a tunable capacitor.

* * * * *